United States Patent [19]
Ko et al.

[11] Patent Number: 5,788,767
[45] Date of Patent: Aug. 4, 1998

[54] METHOD FOR FORMING SINGLE SIN LAYER AS PASSIVATION FILM

[75] Inventors: Jun-Cheng Ko, Taichung; Liang-Tung Tony Chang, Hsinchu, both of Taiwan

[73] Assignee: Vanguard International Semiconductor Corporation, Hsinchu, Taiwan

[21] Appl. No.: 777,585

[22] Filed: Dec. 31, 1996

[51] Int. Cl.⁶ ................................................ C30B 23/08
[52] U.S. Cl. .................... 117/92; 117/108; 117/103; 117/905; 117/952; 438/724; 438/744
[58] Field of Search ..................... 117/92, 103, 108, 117/904, 905, 952; 438/623, 627, 724, 744; 257/649

[56] References Cited

U.S. PATENT DOCUMENTS

| | | | |
|---|---|---|---|
| 4,854,263 | 8/1989 | Chang | 118/715 |
| 5,433,823 | 7/1995 | Cain | 156/662.1 |

*Primary Examiner*—Robert Kunemund
*Assistant Examiner*—Evelyn Defillo
*Attorney, Agent, or Firm*—Christensen, O'Connor Johnson & Kindness PLLC

[57] ABSTRACT

The present invention is a method for using a single SiN layer as a passivation film. The single layer SiN can be strengthened to withstand stress by adjusting the process parameters during formation of the SiN layer. In general, the process can be changed by increasing the low frequency power 5% during the deposition. Alternatively, the pressure of the SiN deposition may be decreased about 20% in pressure.

17 Claims, 1 Drawing Sheet

METHOD FOR FORMING SINGLE SIN LAYER AS PASSIVATION FILM

FIELD OF THE INVENTION

The present invention relates to the passivation process in semiconductor integrated circuit manufacturing and, more particularly, to a method of using a single SiN layer as a passivation film.

BACKGROUND OF THE INVENTION

A passivation process is typically done at the completion of other semiconductor process steps once an integrated circuit (IC) is complete. The passivation process involves the depositing of passivation films over the entire top surface of the wafers. The passivation films serve to seal the device structures on the wafer from the external environment and also serves as a scratch protection films. For example, passivation films prevent moisture and other contaminants from entering the IC package, and also prevents mechanical and chemical damage during assembly and packaging of the IC. Generally, the thicker the passivation film, the more effective the passivation film is at protecting the IC. However, because thicker passivation films have a greater likelihood of cracking, there is normally an upper limit to the thickness of the passivation film.

In the prior art, the passivation process results in two separate layers: a silicon-nitride layer atop of a silicon-oxide layer. The silicon-oxide layer is present to prevent overstress to the IC from the silicon-nitride layer. However, the problem with the two layer approach to passivation of the prior art is that when the spacing between semiconductor structures narrows to the 0.35 to 0.6 micron range, depositing a subsequent silicon-nitride layer can cause overhangs and further lead to the formation of voids in between the semiconductor structures (as shown in FIG. 1).

The voids are undesirable if further semiconductor processes are to be done. FIG. 1 shows a cross-sectional view of a semiconductor wafer illustrating a conventional method for fabricating passivation films. Semiconductor structures 12 are formed on top of a substrate 10. The spacing between the structures 12 is about the 0.35 to 0.6 microns. Next, a silicon-oxide layer 14 is deposited on the structures 12 and then the subsequent silicon-nitride layer 16 is deposited over the silicon-oxide layer 14. The voids 18 are formed at the same time as the deposition of the silicon-nitride layer 16.

Approaches in the prior art to solve this problem include the use of a single layer of passivation material. The use of a silicon-nitride layer alone as a passivation film has become indispensable in the fabrication of 0.35 µm devices and below. Unfortunately, the problem with single film passivation is that there is stress between the SiN layer and the underlying structures. This stress manifests itself as cracking or defects (e.g., pinholes) in the SiN layer that allows the external environment access to the IC. The accepted industry test for determining if there are cracks in the passivation layer is the so-called "pin-hole test" of immersing the IC in KOH solution. If there are any cracks or pin-holes in the passivation layer, the KOH will attack the underlying structures and will be easily viewable under magnification.

Thus, there is a need for a single layer passivation film that is resistant to pinhole formation.

SUMMARY OF THE INVENTION

In accordance with the present invention, a method for using a single SiN layer as a passivation film is disclosed. This method comprises two steps: (1) forming a semiconductor structure on top of a substrate, and (2) forming a silicon-nitride layer on the structure by plasma enhanced chemical vapor deposition (PECVD).

The single layer SiN can be strengthened by adjusting the process parameters during formation of the SiN layer. For a machine sold under the trademark NOVELLUS, the process is changed by increasing the low frequency power during the deposition from 0.43 to 0.45 kW and by decreasing the high frequency power from 0.57 KW down to 0.55 KW. The increase or decrease should be phrased as an increase or decrease optimally of 5%, with a range of 2.5% to 7.5%. It is found that by increasing the low frequency power, the SiN layer is strengthened.

Another method that is operative with a machine sold under the trademark APPLIED MATERIALS as PR5000 is to increase susceptor spacing from 600 mil up to 650 mil and to decrease the pressure of the SiN deposition from 4.22 to 3.35 torr, i.e., about 20% reduction in pressure. In other words, pressure should be decreased optimally 20%, but within the range of 15%–25% is also acceptable.

BRIEF DESCRIPTION OF THE DRAWINGS

The forgoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
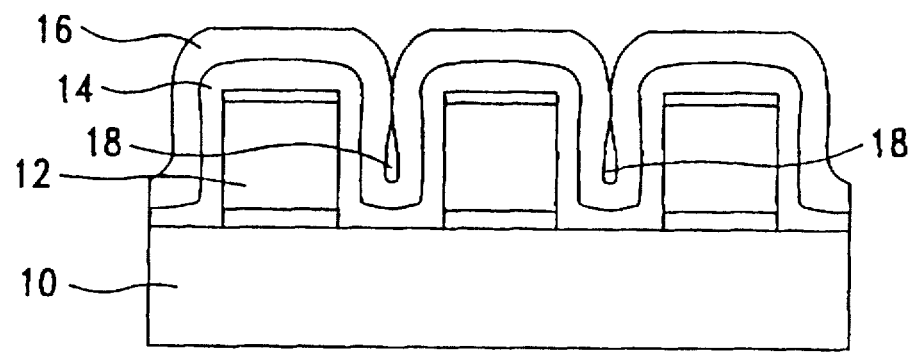
FIG. 1 shows a cross-section view of a semiconductor wafer illustrating a conventional method for fabricating passivation films.
Figure 2:
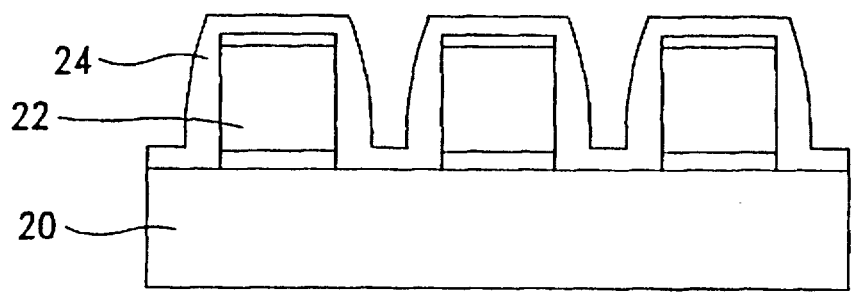
FIG. 2 shows a cross-section view of a semiconductor wafer illustrating a method in accordance with the present invention for fabricating a single layer passivation film.

FIG. 2 shows a cross-section view of a semiconductor wafer illustrating an invention method for fabricating single passivation film. Using conventional techniques, a semiconductor structure is formed on a substrate 20. In the preferred embodiment, the semiconductor structure is a conductor 22 used, for example as a metal contact or a via. The main steps of forming the conductors 22 comprises depositing a metal-2 layer on the top of a substrate 20 and then patterning the metal-2 layer to obtain the conductors 22. Typically, the composition of metal-2 layer is either tungsten (W)or aluminum(Al).

After forming conductors 22, the next step is to deposit a silicon-nitride layer 24 onto the conductors 22. This step is done by a plasma-enhanced chemical vapor deposition (PECVD) method using $SiH_4$, $N_2$, and $NH_3$ vapor at a temperature of about 400° C. The silicon-nitride layer 24 then serves as a passivation film. The silicon-nitride layer 24 is between about 3000 and 5000 angstroms thick.

To overcome the stress problem as described above, it has been found that the silicon-nitride layer 24 can be strengthened by adjusting the PECVD process parameters in the formation of the silicon-nitride layer 24. In particular, PECVD apparatus sold under the trademark NOVELLUS and under the trademark APPLIED MATERIALS have been tested.

For the apparatus sold under the trademark NOVELLUS, the preferred set of parameters for is listed in Table

TABLE ONE (for machine sold under the trademark NOVELLUS)

|  | Prior art | Invention |
|---|---|---|
| RF | 400 W | 400 W |
| $NH_3$ | 4 l | 4 l |
| $SiH_4$ | 0.55 l | 0.55 l |
| $N_2$ | 1.6 l | 1.6 l |
| Hf | 0.57 KW | 0.55 KW |
| Lf | 0.43 KW | 0.45 KW |
| Temp. | 400° C. | 400° C. |
| pressure | 2.6 torr | 2.6 torr |

The middle column represents the recommended process parameters and the right column represents process parameters preferred in accordance to the present invention. As is apparent, two parameter settings are modified. The parameter of low frequency (Lf) power is changed by increasing the power output nominally about 5% from 0.43 KW up to 0.45 KW. The parameter of high frequency power is also changed by decreasing about 5% from 0.57 KW down to 0.55 KW. In principle, it is expected that stronger ion bombardment is created as the Lf power is increased, resulting in a higher density of silicon-nitride in the deposited layer. The increase for Lf power should be phrased as an increase optimally of 5%, with a range of 2.5% to 7.5% increase and the decrease for Hf power should be phrased as a decrease optimally of 5%, with a range of 2.5% to 7.5% decrease. The experimental results indicate that the silicon-nitride layer deposited under this condition can pass pin hole test as shown in Table 3.

Second, for the apparatus sold under the trademark APPLIED MATERIALS as PR5000, the preferred set of parameters for is listed in Table 2.

TABLE TWO (for machine sold under the trademark APPLIED MATERIALS as PR5000)

|  | Prior art | Invention |
|---|---|---|
| RF | 760 W | 760 W |
| Susceptor spacing | 600 mil | 650 mil |
| $SiH_4$ | 270 sccm | 270 sccm |
| $N_2$ | 5000 sccm | 5000 sccm |
| $NH_3$ | 80 sccm | 80 sccm |
| Temp. | 400° C. | 400° C. |
| Pressure | 4.2 torr | 3.35 torr |

The middle column represents the recommended process parameters and the right column represents process parameters preferred in accordance to the present invention. The changed process condition is to decrease the pressure of the silicon-nitride deposition from 4.22 to 3.35 torr, i.e., about a 20% reduction in pressure. The pressure should be decreased optimally 20%, but within the range of 15%–25% is also sufficient. The plasma-enhanced chemical vapor deposition (PECVD) method is worked with the machine sold under the trademark APPLIED MATERIALS as PR5000 at a pressure of about 3.35 torr with a range of 3.57 to 3.15 torr. Principally, as the total pressure is decreased, the mean free path of the ion becomes larger, resulting in an enhanced conformality of the silicon-nitride layer being deposited.

From Table 2, the parameter of susceptor spacing is also changed by increasing the spacing from 600 mil up to 650 mil. The increase in the spacing also attributed allows for enhanced conformality. The other parameters keep the same with the prior art condition: the radio-frequency( RF ) is about 760 W, the gas flow of $SiH_4$ vapor is about 270 sccm, the gas flow of $N_2$ vapor about 5000 sccm, and the gas flow of $NH_3$ vapor about 80 sccm. The experimental results indicate that silicon-nitride film deposited under this condition show lower stress and good conformality and pass pin hole test successfully.

Table 3 shows the results of the pin hole test of wafers having a passivation layer formed from prior art methods and methods in accordance with the present invention. Wafers 4 and 5 are processed in accordance with the present invention with a single SiN layer as a passivation film. As seen, these wafers pass the pin hole test.

Furthermore, the single SiN layer of wafers 4 and 5 as deposited by the present invention is only about 4000 Å thick. In addition, the two methods of this invention are suitable for 0.35 μm devices and below. There is no void formation and no stress problem. This invention also reduces the cost of the process.

TABLE THREE

| Wafer | Oxide | SiN | Pin hole test | |
|---|---|---|---|---|
| 1 (prior art) | 2000Å | 7000Å | pass | void formation |
| 2 (prior art) | 2000Å | 5000Å | fail | |
| 3 (prior art) | 1000Å | 5000Å | fail | |
| 4 | none | 4000Å | pass | decrease total pressure |
| 5 | none | 4000Å | pass | increase in Lf power |

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method for forming a single SiN layer as a passivation film, the method comprising the steps of:

forming a conductor over top of a substrate; and forming a silicon-nitride layer directly on the conductor and the substrate by a plasma enhanced chemical vapor deposition (PECVD) using a PECVD apparatus, said PECVD apparatus having a recommended set of process parameters, wherein the silicon-nitride layer is formed while increasing a low frequency power approximately 3%–8% above a recommended level, wherein said silicon-nitride layer serves as the passivation film.

2. The method according to claim 1 further wherein a high frequency power is decreased approximate 3%–8% below the recommended level.

3. The method according to claim 1 wherein said conductor is a conductive layer selected from the group consisting of W and Al.

4. The method according to claim 1 wherein said silicon-nitride layer is between about 3000 and 5000 angstroms thick.

5. The method according to claim 1 wherein said PECVD uses $SiH_4$, $N_2$, and $NH_3$ vapor.

6. The method according to claim 2 wherein the low frequency power is about 0.4475 KW to 0.4622 KW and the high frequency power is about 0.5272 KW to 0.5555 KW.

7. The method according to claim 6 wherein a radio-frequency (RF) power is about 400 W.

8. The method according to claim 6 wherein a process pressure is about 2.6 torr.

9. The method according to claim 6 wherein said low frequency power is about 0.45 KW.

10. The method according to claim 6 wherein said high frequency power is about 0.55 KW.

11. A method for forming a single SiN layer as a passivation film, the method comprising the steps of:

forming a conductor over top of a substrate; and forming a silicon-nitride layer directly on the conductor and the substrate by a plasma enhanced chemical vapor deposition (PECVD) using a PECVD apparatus, said PECVD apparatus having a recommended set of process parameters, wherein the silicon-nitride layer is formed while decreasing a pressure approximately 3%–8% below a recommended level, wherein said silicon-nitride layer serves as the passivation film.

12. The method according to claim 11 further wherein a susceptor spacing is increased approximate 3%–8% above a recommended level.

13. The method according to claim 11 wherein said conductor is a conductive layer selected from the group consisting of W and Al.

14. The method according to claim 11 wherein said silicon-nitride layer is between about 3000 and 5000 angstroms thick.

15. The method according to claim 11 wherein said PECVD uses $SiH_4$, $N_2$, and $NH_3$ vapor.

16. The method according to claim 12 wherein said pressure is about 3.35 torr.

17. The method according to claim 16 the susceptor spacing is about 650 mils.

* * * * *